United States Patent
Uematsu et al.

(10) Patent No.: US 10,084,125 B2
(45) Date of Patent: Sep. 25, 2018

(54) ELECTRONIC COMPONENT

(71) Applicant: SKYWORKS FILTER SOLUTIONS JAPAN CO., LTD., Kadoma-Shi (JP)

(72) Inventors: Hidenori Uematsu, Osaka-Fu (JP); Tomohiro Fujita, Osaka-Fu (JP); Ichiro Kameyama, Osaka-Fu (JP); Tetsuya Furihata, Osaka-Fu (JP); Fuyuki Abe, Kyoto-Fu (JP); Kazunori Nishimura, Kyoto-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 540 days.

(21) Appl. No.: 14/413,514

(22) PCT Filed: Jul. 2, 2013

(86) PCT No.: PCT/JP2013/004095
§ 371 (c)(1),
(2) Date: May 18, 2015

(87) PCT Pub. No.: WO2014/010197
PCT Pub. Date: Jan. 16, 2014

(65) Prior Publication Data
US 2015/0270473 A1    Sep. 24, 2015

(30) Foreign Application Priority Data

Jul. 11, 2012 (JP) .................................. 2012-155313
Dec. 21, 2012 (JP) .................................. 2012-279001

(51) Int. Cl.
*H01L 41/053* (2006.01)
*H03H 9/10* (2006.01)
(Continued)

(52) U.S. Cl.
CPC .......... *H01L 41/053* (2013.01); *H01L 41/047* (2013.01); *H01L 41/107* (2013.01); *H03H 9/1092* (2013.01)

(58) Field of Classification Search
CPC ... H01L 41/053; H01L 41/047; H01L 41/107; H03H 9/1092; H03H 9/0504; H03H 9/0509
(Continued)

(56) References Cited

U.S. PATENT DOCUMENTS

2007/0182028 A1* 8/2007 Takano .................... H03H 3/08
                                                              257/787
2009/0045509 A1* 2/2009 Tanaka .................... H01L 24/11
                                                              257/737
(Continued)

FOREIGN PATENT DOCUMENTS

JP        S6236456 A      2/1987
JP      2003101383 A      4/2003
(Continued)

OTHER PUBLICATIONS

International Search Report from corresponding International Application No. PCT/JP2013/004095.

*Primary Examiner* — Bryan Gordon
(74) *Attorney, Agent, or Firm* — Lando & Anastasi, LLP (57) ABSTRACT

An electronic component includes a substrate a functional section provided on the substrate, and a sealing body which is provided on the substrate and seals the functional section. In a temperature region having a lowest temperature that is at least as high as the glass transition temperature of the sealing body, the coefficient of linear expansion of the sealing body is greater than the coefficient of linear expansion of the substrate. In a temperature region having a highest temperature that is lower than the glass transition temperature of the sealing body, the coefficient of linear
(Continued)

expansion of the sealing body is less than the coefficient of linear expansion of the substrate. The electronic component exhibits superior reliability even upon prolonged use.

19 Claims, 7 Drawing Sheets

(51) Int. Cl.
*H01L 41/047* (2006.01)
*H01L 41/107* (2006.01)

(58) Field of Classification Search
USPC .............................................. 310/313 R, 348
See application file for complete search history.

(56) References Cited

U.S. PATENT DOCUMENTS

2010/0014143 A1* 1/2010 Kanno .................... B81B 3/004
359/224.1

2010/0277037 A1* 11/2010 Fukano .................. H03H 9/059
310/313 C
2011/0221546 A1* 9/2011 Yamaji ................ H03H 9/1071
333/193
2012/0037842 A1* 2/2012 Kubota ................ C01G 53/006
252/70

FOREIGN PATENT DOCUMENTS

| | | | |
|---|---|---|---|
| JP | 2005051291 A | 2/2005 |
| JP | 2005217177 A | 8/2005 |
| JP | 2006033748 A | 2/2006 |
| JP | 2006304145 A | 11/2006 |
| JP | 2007096519 A | 4/2007 |
| JP | 2009200996 A | 9/2009 |
| JP | 2010245704 A | 10/2010 |
| JP | 2011147098 A | 7/2011 |

* cited by examiner

ELECTRONIC COMPONENT

CROSS REFERENCE TO RELATED APPLICATIONS

This application is a national stage application under 35 U.S.C. § 371 of International Patent Application Ser. No. PCT/JP2013/004095 filed Jul. 2, 2013 which is hereby incorporated by reference in its entirety for all purposes. PCT/JP2013/004095 claims priority to Japanese Patent Application Ser. No. 2012-155313 filed Jul. 11, 2012 and Japanese Patent Application Ser. No. 2012-279001 filed Dec. 21, 2012.

TECHNICAL FIELD

The present invention relates to an electronic component used in a variety of electronic equipment.

BACKGROUND

Figure 14A:
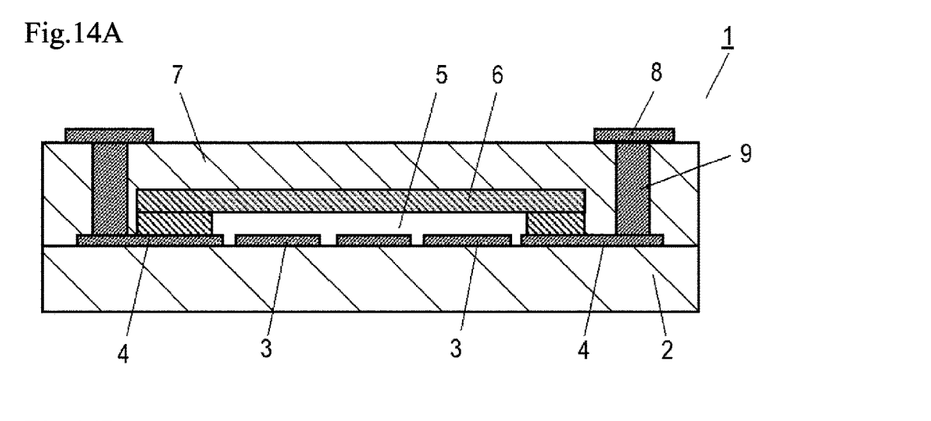
FIG. 14A is a schematic cross-sectional view of a conventional electronic component.
Figure 14B:
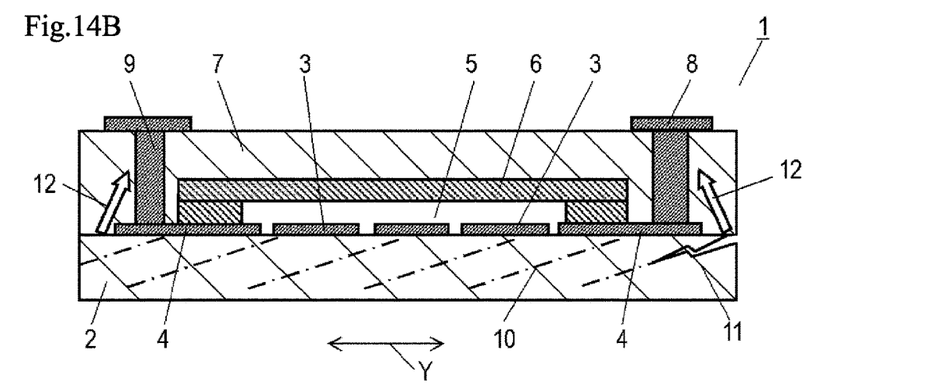
FIG. 14B is a schematic cross-sectional view of a conventional electronic component.

FIG. 14A and FIG. 14B are schematic cross-sectional views of a conventional electronic component 1 including an elastic wave device. The electronic component 1 has a piezoelectric substrate 2 composed of a piezoelectric single crystal, a comb-shaped electrode 3 provided on the piezoelectric substrate 2, wiring 4 provided on the piezoelectric substrate 2, a space 5 which is excited by the comb-shaped electrode 3, a cover 6 which covers the space 5, a sealing body 7 which seals the space 5 from above the cover 6, a terminal electrode 8 provided on the sealing body 7, and a connection electrode 9 which penetrates through the sealing body 7 and connects the wiring 4 and the terminal electrode 8.

In the electronic component 1, prolonged use can sometimes cause cracks 11 to form in the piezoelectric substrate 2, damaging the electronic component.

Another conventional electronic component similar to the electronic component 1 is disclosed in Japanese Patent Application No. JP 2001-185976 A.

SUMMARY

In accordance with one aspect, an electronic component comprises a substrate, a functional section provided on the substrate, and a sealing body which is provided on the substrate and seals the functional section. In a temperature region having a lowest temperature that is at least as high as the glass transition temperature of the sealing body, the coefficient of linear expansion of the sealing body is greater than the coefficient of linear expansion of the substrate. In a temperature region having a highest temperature that is lower than the glass transition temperature of the sealing body, the coefficient of linear expansion of the sealing body is less than the coefficient of linear expansion of the substrate.

This electronic component exhibits superior reliability even upon prolonged use.

DETAILED DESCRIPTION

Figure 1:
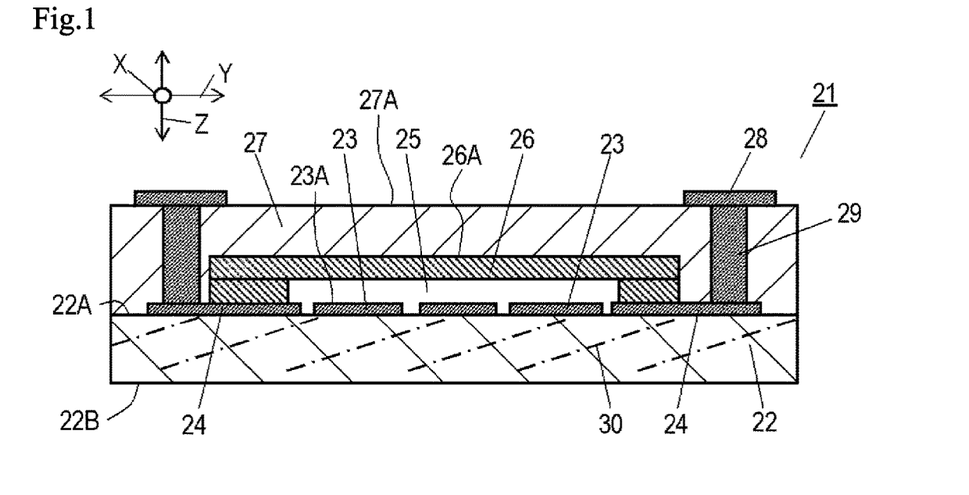
FIG. 1 is a schematic cross-sectional view of an embodiment of an electronic component.

FIG. 1 is a schematic cross-sectional view of an electronic component 21 in an embodiment of the present invention. The electronic component 21 comprises an elastic wave device. The electronic component 21 includes a substrate 22, a comb-shaped electrode 23 provided on an upper surface 22A of the substrate 22, wiring 24 provided on the upper surface 22A of the substrate 22, a space 25 positioned above an upper surface 23A of the comb-shaped electrode 23, a cover 26 which covers the space 25 from above, a sealing body 27 which covers the space 25 from an upper surface 26A of the cover 26, a terminal electrode 28 provided on an upper surface 27A of the sealing body 27, and a connection electrode 29 which penetrates through the sealing body 27 and connects the wiring 24 and the terminal electrode 28. The comb-shaped electrode 23 excites the space 25. The electronic component 21 occupies the same surface area as the substrate 22 and is extremely small. The sealing may be performed and the terminal electrode 28 formed in a wafer state prior to division of the substrate 22 into individual components. The electronic component 21 may be referred to as a wafer-level chip size package (CSP).

The electronic component 21 need not have the connection electrode 29 and the terminal electrode 28. In such implementations, by exposing the wiring 24 and using the exposed wiring as an electrode, signals from the comb-shaped electrode 23 can be extracted from the electronic component 21.

In the embodiment illustrated in FIG. 1, the substrate 22 is formed from a piezoelectric material, and more specifically, is composed of a rotated Y-cut X-propagation lithium tantalate single crystal. The substrate thickness, namely the distance from the upper surface 22A to a lower surface 22B of the substrate 22 is about 100 μm to 350 μm. Surface acoustic waves are propagated at the upper surface 22A of the substrate 22. As illustrated in FIG. 1, an X-axis, a Y-axis and a Z-axis are defined for the electronic component 21. The direction in which the surface acoustic waves are propagated along the upper surface 22A is defined as the X-axis direction. The direction along the upper surface 22A orthogonal to the X-axis is defined as the Y-axis direction. The direction orthogonal to the X-axis and the Y-axis, namely the thickness direction of the substrate 22, is defined as the Z-axis direction. The coefficient of linear expansion αX of the substrate 22 in the X-axis direction is 16.2 ppm/° C., and the coefficient of linear expansion αY in the Y-axis direction is 9.7 ppm/° C. The substrate 22 has cleavage planes 30 which extend in a direction having an acute angle relative to the Y-axis direction.

The comb-shaped electrode 23 is composed of a metal containing aluminum as the main component, and is formed on the upper surface 22A of the substrate 22. By applying a voltage to the comb-shaped electrode 23, surface acoustic waves are excited at the upper surface 22A of the substrate 22. A protective film formed from a dielectric material such as silicon oxide may be formed on the surface of the comb-shaped electrode 23. In this manner, the comb-shaped electrode 23 is a functional section which enables the electronic component 21 to function as an elastic wave device.

The wiring 24 is composed of a conductor formed on the upper surface 22A of the substrate 22, and is connected electrically to the comb-shaped electrode 23.

The space 25 is a sealed cavity provided above the upper surface 23A of the comb-shaped electrode 23, and is used for exciting surface acoustic waves at the upper surface 22A of the substrate 22.

The cover 26 is formed from a polyimide-based resin, and covers the comb-shaped electrode 23 from the upper surface 22A of the substrate 22 with the space 25 disposed therebetween.

The sealing body 27 is an insulating body which covers the space 25 from above the cover 26, and is formed by heat-curing a composition comprising a heat-curable resin and an inorganic filler.

The terminal electrode 28 is a conductor which is used as an input-output terminal or a ground terminal for the electronic component 21, and is formed on the upper surface 27A of the sealing body 27 by photolithography.

The connection electrode 29 is a conductor which penetrates through the sealing body 27 and connects the wiring 24 and the terminal electrode 28, and is formed, for example, by electrolytic copper plating.

The electronic component 21 need not have the cover 26 and the space 25.

The sealing body 27 of the electronic component 21 in the embodiment illustrated in FIG. 1 is formed by heat-curing a material having 10±2 wt % of a heat-curable resin containing an epoxy-based component and a rubber-based component, and 90±2 wt % of an inorganic filler containing silicon dioxide as the main component. The components of the heat-curable resin are adjusted so that the curing temperature for the sealing body 27 is 180° C., and the glass transition temperature TgA of the sealing body 27 measured using a DMA device is 50° C. In this manner, the glass transition temperature TgA of the sealing body 27 is adjusted so as to fall within the operating temperature range for the electronic component 21 of −55° C. to 125° C. By employing a sealing body 27 composed in this manner, the electronic component 21 can suppress any damage to the substrate 22 caused by temperature fluctuations within the operating temperature range from −55° C. to 125° C., thus improving the reliability upon prolonged use.

FIG. 2 to FIG. 5 are diagrams illustrating characteristics of the sealing body 27.

Figure 2:
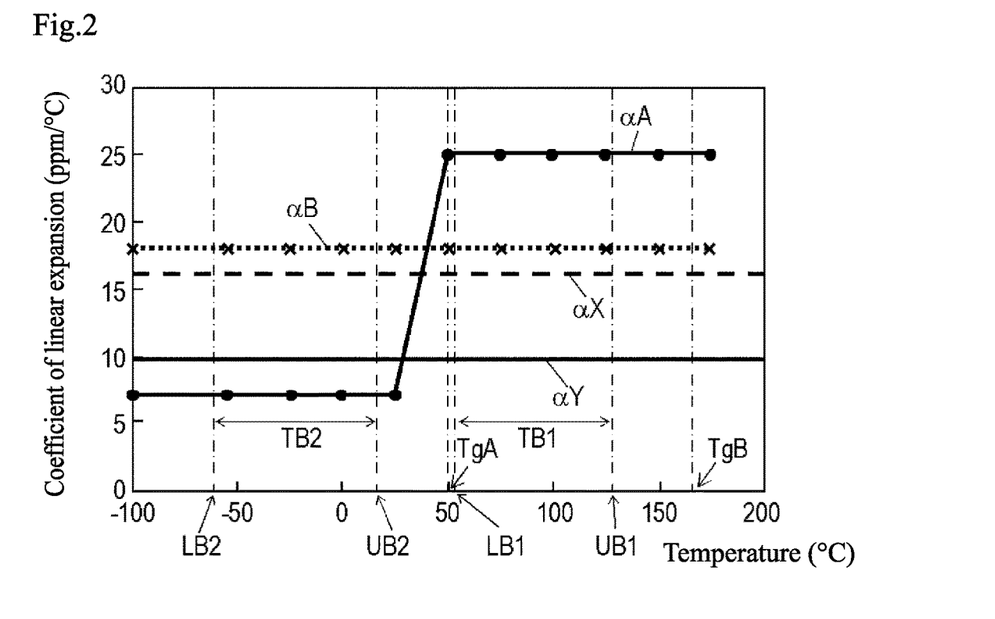
FIG. 2 is a diagram illustrating a first set of temperature characteristics of the sealing body of the electronic component of FIG. 1.

FIG. 2 illustrates the change in the coefficient of linear expansion αA of the sealing body 27 in the X-axis direction and the Y-axis direction relative to temperature, together with the change in the coefficient of linear expansion αB in the X-axis direction and the Y-axis direction of the sealing body 7 of the conventional electronic component 1 illustrated in FIG. 14A relative to temperature. In FIG. 2, the vertical axis indicates the coefficient of linear expansion and the horizontal axis indicates the temperature. The sealing body 27 of the electronic component 21 illustrated in FIG. 1 and the sealing body 7 of the conventional electronic component 1 illustrated in FIG. 14A do not have anisotropy, and therefore the coefficient of linear expansion in the X-axis direction and the coefficient of linear expansion in the Y-axis direction are equal. FIG. 2 also illustrates the coefficient of linear expansion αX in the X-axis direction and the coefficient of linear expansion αY in the Y-axis direction for the substrate 22 of the electronic component 21 in the embodiment illustrated in FIG. 1. The coefficients of linear expansion for the substrate 2 of the conventional electronic component 1 are the same as those for the substrate 22 in the embodiment illustrated in FIG. 1. The sealing body 7 is formed from a typical heat-curable resin.

The sealing body 27 of the electronic component 21 has a glass transition temperature TgA, and the sealing body 7 of the conventional electronic component 1 has a glass transition temperature TgB. The glass transition temperature TgB is 161° C.

For the substrates 2 and 22 composed of a single crystal of lithium tantalate, the coefficient of linear expansion αX in the X-axis direction is 16.2 ppm/° C., and the coefficient of linear expansion αY in the Y-axis direction is 9.7 ppm/° C. Because the coefficient of linear expansion αX in the X-axis direction is large, the change in the dimension in the X-axis direction caused by change in the temperature is large, meaning the electrical characteristics of the electronic component 21 are affected by changes in the temperature.

The glass transition temperature TgB of the sealing body 7 of the conventional electronic component 1 is 161° C., which is higher than the operating temperature range for the electronic component 1 of −55° C. to 125° C., and represents the glass transition temperature for a typical heat-curable resin used in electronic components. The coefficient of linear expansion αB of the sealing body 7 of the conventional electronic component 1 at a temperature not higher than the glass transition temperature TgB is set to a value similar to the coefficient of linear expansion αX in the X-axis direction of the substrate 2. Accordingly, the dimension of the sealing body 7 changes so as to match the change in the X-axis direction dimension of the substrate 2, and therefore the amount of stress in the X-axis direction imparted to the substrate 2 from the sealing body 7 is small. The coefficient of linear expansion αB of the sealing body 7 of the conventional electronic component 1 exhibits temperature dependency at temperatures higher than the glass transition temperature TgB, but the effect of this temperature dependency on the reliability of the conventional electronic component 1 is minimal, and is not shown in FIG. 2.

As illustrated in FIG. 2, the glass transition temperature TgA of the sealing body 27 of the electronic component 21 in the embodiment 1 is set to 50° C., and at temperatures lower than the glass transition temperature TgA, the coefficient of linear expansion αA is 7 ppm/° C., which is lower than the coefficients of linear expansion αX and αY of the substrate 22, whereas at temperatures higher than the glass transition temperature TgA, the coefficient of linear expansion αA is 25 ppm/° C., which is greater than the coefficients of linear expansion αX and αY of the substrate 22.

As illustrated in FIG. 2, two regions are defined for the temperature—a temperature region TB1 from a lowest temperature LB1 to a highest temperature UB1, and a temperature region TB2 from a lowest temperature LB2 to a highest temperature UB2. The lowest temperature LB1 of the temperature region TB1 is at least as high as the glass transition temperature TgA of the sealing body 27. The highest temperature UB2 of the temperature region TB2 is lower than the glass transition temperature TgA. The highest temperature UB1 of the temperature region TB1 is equal to or higher than the maximum temperature of the operating temperature range in which the electronic component 21 is used, and the lowest temperature LB2 of the temperature region TB2 is equal to or lower than the minimum temperature of the operating temperature range in which the electronic component 21 is used. In the temperature region TB1, the coefficient of linear expansion αA of the sealing body 27 is greater than the coefficients of linear expansion αX and αY of the substrate 22, and in the temperature region TB2, the coefficient of linear expansion αA of the sealing body 27 is less than the coefficients of linear expansion αX and αY of the substrate 22.

Figure 3:
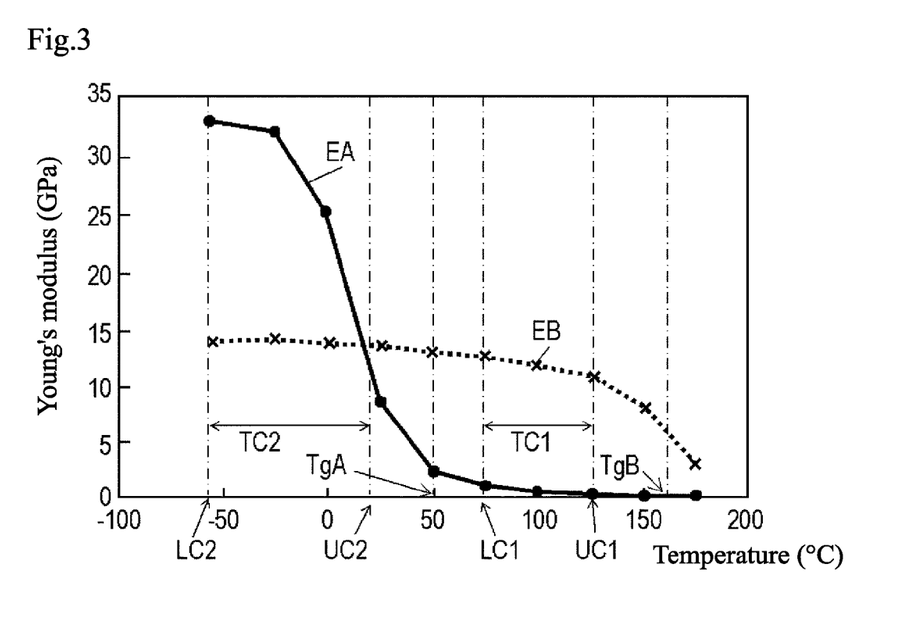
FIG. 3 is a diagram illustrating a second set of temperature characteristics of the sealing body of the electronic component of FIG. 1.

FIG. 3 illustrates the change in the Young's modulus EA of the sealing body 27 of the electronic component 21 in the embodiment illustrated in FIG. 1 relative to temperature, together with the change in the Young's modulus EB of the sealing body 7 of the conventional electronic component 1 relative to temperature. In FIG. 3, the vertical axis indicates the Young's modulus, and the horizontal axis indicates the temperature. The Young's modulus of the substrates 2 and 22 composed of a single crystal of lithium tantalate is about 273 GPa.

As illustrated in FIG. 3, the Young's modulus EB of the sealing body 7 of the conventional electronic component 1 gradually increases as the temperature falls below the glass transition temperature TgB, and at temperatures of 125° C. or lower, the Young's modulus EB is 10 GPa or greater, with the Young's modulus EB approaching 15 GPa as the temperature is lowered toward −55° C.

As illustrated in FIG. 3, the Young's modulus EA of the sealing body 27 of the electronic component 21 in the embodiment illustrated in FIG. 1 is extremely small at temperatures higher than the glass transition temperature TgA, with the Young's modulus EA at temperatures of 75° C. or higher being 1 GPa or less, and the Young's modulus EA at temperatures of 100° C. or higher being 0.5 GPa or less. At temperatures lower than the glass transition temperature TgA, the Young's modulus EA is comparatively large, with the Young's modulus EA at temperatures of 0° C. or lower being at least 20 GPa, and the Young's modulus EA at temperatures of −25° C. or lower being 30 GPa or higher. These types of characteristics for the Young's modulus EA can be obtained by appropriate adjustment of the composition and the blend proportions of the heat-curable resin and the inorganic filler.

As illustrated in FIG. 3, two regions are defined for the temperature—a temperature region TC1 from a lowest temperature LC1 to a highest temperature UC1, and a temperature region TC2 from a lowest temperature LC2 to a highest temperature UC2. The lowest temperature LC1 of the temperature region TC1 is at least as high as the glass transition temperature TgA of the sealing body 27. The highest temperature UC2 of the temperature region TC2 is lower than the glass transition temperature TgA. The highest temperature UC1 of the temperature region TC1 is equal to or higher than the maximum temperature of the operating temperature range in which the electronic component 21 is used, and the lowest temperature LC2 of the temperature region TC2 is equal to or lower than the minimum temperature of the operating temperature range in which the electronic component 21 is used. The Young's modulus of the sealing body 27 in the temperature region TC1 is $1/10$ or less of the Young's modulus of the sealing body 27 in the temperature region TC2.

Figure 4:
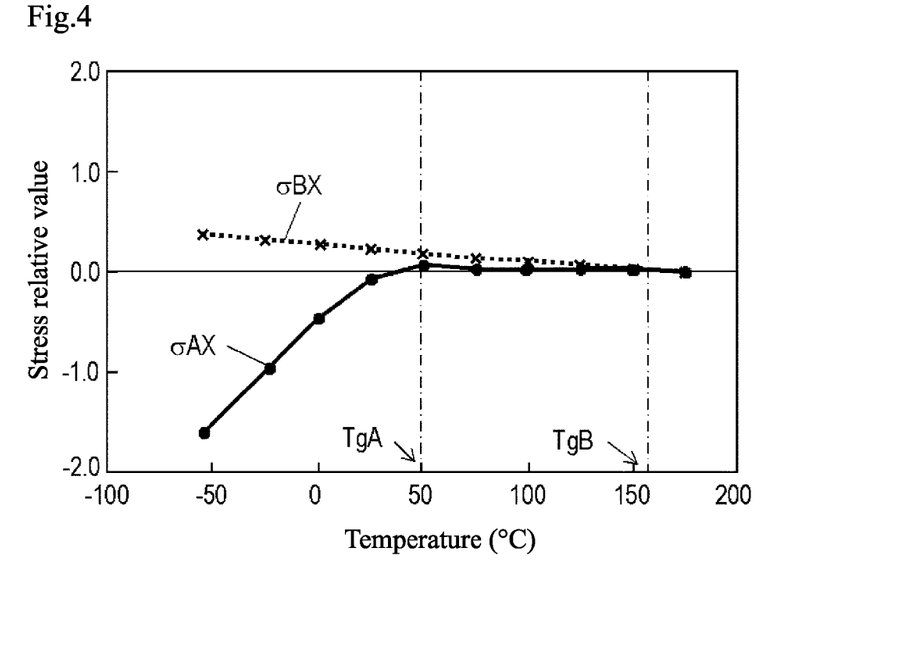
FIG. 4 is a diagram illustrating a third set of temperature characteristics of the sealing body of the electronic component of FIG. 1.

FIG. 4 illustrates the change in the relative value σAX for the X-axis direction stress imparted by the sealing body 27 to the substrate 22 in the electronic component 21 of the embodiment illustrated in FIG. 1 relative to temperature. FIG. 4 also illustrates the change in the relative value σBX for the X-axis direction stress imparted by the sealing body 7 to the substrate 2 in the conventional electronic component 1 relative to temperature. The stress can be determined by simulation using the coefficient of linear expansion and the Young's modulus. When the relative values σAX and σBX for the X-axis direction stress are positive, the sealing bodies 7 and 27 undergo a greater contraction in the X-axis direction than the respective substrates 2 and 22, and a tensile stress is imparted to the substrates 2 and 22. When the relative values σAX and σBX for the stress are negative, the sealing bodies 7 and 27 undergo a greater expansion in the X-axis direction than the respective substrates 2 and 22, and a compressive stress is imparted to the substrates 2 and 22.

As illustrated in FIG. 4, the relative value σAX for the stress of the sealing body 27 of the electronic component 21 in the embodiment 1 is zero at the curing temperature 180° C. of the sealing body 27, increases slightly as the temperature decreases, reaches a local maximum near the glass transition temperature TgA, and then decreases at temperatures lower than the glass transition temperature TgA, reaching a value of about −1.8 at −55° C. In this manner, the stress of the sealing body 27 of the electronic component 21 is extremely small and close to zero in the portion of the operating temperature range from 50° C. to 125° C. having a higher temperature than the glass transition temperature TgA, but imparts compressive stress to the substrate 22 in the portion of the operating temperature range from −55° C. to 25° C. having a lower temperature than the glass transition temperature TgA. At low temperatures, the sealing body 27 generates X-axis direction stress in the electronic component 21. However, because that stress is compressive stress, it does not act upon the substrate 22 in a manner that would cause the substrate 22 to pull apart at the cleavage planes 30. The stress acts upon the substrate 22 in a manner that compresses the substrate 22 at the cleavage planes 30 of the substrate 22, thereby inhibiting destruction of the substrate 22 and enabling the reliability of the electronic component 21 to be improved.

In contrast, as illustrated in FIG. 4, the relative value σBX for the X-axis direction stress of the sealing body 7 of the conventional electronic component 1 is zero at the curing temperature 180° C. of the sealing body 7, and then gradually increases as the temperature decreases, reaching a value of about +0.4 at −55° C. In this manner, in the conventional electronic component 1, the X-axis direction stress of the sealing body 7 is a tensile stress, but because the size of that stress is comparatively small, the effect on the electronic component 1 is minimal.

Figure 5:
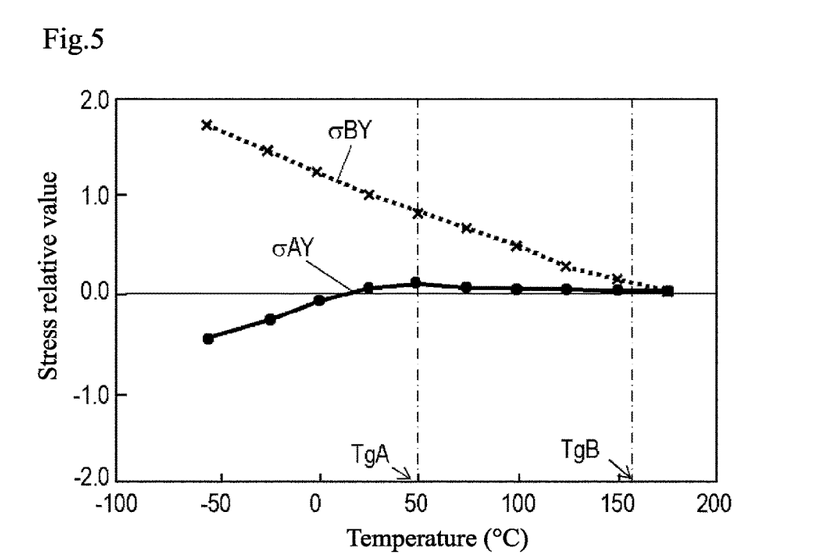
FIG. 5 is a diagram illustrating a fourth set of temperature characteristics of the sealing body of the electronic component of FIG. 1.

FIG. 5 illustrates the change in the relative value σAY for the Y-axis direction stress imparted by the sealing body 27 to the substrate 22 in the electronic component 21 of the embodiment illustrated in FIG. 1 relative to temperature. FIG. 5 also illustrates the change in the relative value σBY for the Y-axis direction stress imparted by the sealing body 7 to the substrate 2 in the conventional electronic component 1 relative to temperature. Each of the relative values σAY and σBY for the stress can be determined by simulation using the coefficient of linear expansion and the Young's modulus. When the relative values σAY and σBY for the Y-axis direction stress are positive, the sealing bodies 7 and 27 undergo a greater contraction in the Y-axis direction than the respective substrates 2 and 22, and a tensile stress is imparted to the substrates 2 and 22. When the relative values σAY and σBY for the Y-axis direction stress are negative, the sealing bodies 7 and 27 undergo a greater expansion in the Y-axis direction than the respective substrates 2 and 22, and a compressive stress is imparted to the substrates 2 and 22.

As illustrated in FIG. 5, the relative value σBY for the Y-axis direction stress imparted by the sealing body 7 to the substrate 2 of the conventional electronic component 1 is zero at the curing temperature 180° C. of the sealing body 7, and then gradually increases as the temperature decreases from this curing temperature, reaching a value of about +1.8 at −55° C. At −55° C., the sealing body 7 of the conventional electronic component 1 imparts a tensile stress 12 to the substrate 2, and this tensile stress 12 increases as the temperature decreases. Because the substrate 2 has cleavage planes 10 along a direction having an acute angle relative to the Y-axis direction, the tensile stress 12 acts upon the substrate 2 in a manner that pulls the substrate 2 apart in a direction perpendicular to the cleavage planes 10, which can sometimes result in the formation of a crack 11 along the cleavage planes 10 starting at the edge of the substrate 2, as illustrated in FIG. 14B.

As illustrated in FIG. 5, the relative value σAY for the Y-axis direction stress of the sealing body 27 of the electronic component 21 in the embodiment illustrated in FIG. 1 is zero at the curing temperature 180° C. of the sealing body 27, increases slightly as the temperature decreases, reaches a local maximum near the glass transition temperature TgA, and then decreases at temperatures lower than the glass transition temperature TgA, reaching a value of about −0.4 at −55° C. In this manner, in the sealing body 27 of the electronic component 21, the Y-axis direction stress is extremely small and close to zero in the portion of the operating temperature range from 50° C. to 125° C. having a higher temperature than the glass transition temperature TgA, and has a comparatively small Y-axis direction compressive stress in the portion of the operating temperature range from −55° C. to 25° C. having a lower temperature than the glass transition temperature TgA. In this manner, the electronic component 21 exhibits minimal stress in the Y-axis direction of the sealing body 27, and moreover, because this stress is compressive stress, it does not act upon the substrate 22 in a manner that would cause the substrate 22 to pull apart at the cleavage planes 30. Accordingly, the effect of this stress on the substrate 22 can be reduced, and the reliability of the electronic component 21 can be improved.

As described above, in the electronic component 21 in the embodiment illustrated in FIG. 1, in the temperature region TB1 having a lowest temperature LB1 that is at least as high as the glass transition temperature TgA of the sealing body 27, the coefficient of linear expansion αA of the sealing body 27 is greater than one of the coefficients of linear expansion αX and αY of the substrate 22, whereas in the temperature region TB2 having a highest temperature UB2 that is lower than the glass transition temperature TgA, the coefficient of linear expansion αA of the sealing body 27 is less than the coefficients of linear expansion αX and αY of the substrate 22. As a result, the stress imparted by the sealing body 27 to the substrate 22 can be reversed from a tensile stress to a compressive stress at temperatures on both sides of the glass transition temperature TgA of the sealing body 27. Accordingly, damage to the substrate 22 caused by thermal expansion or thermal contraction can be reduced, and the long-term reliability of the electronic component 21 can be improved.

Alternatively, in the electronic component 21 in the embodiment illustrated in FIG. 1, the Young's modulus of the sealing body 27 in the temperature region TC1 having a lowest temperature LC1 that is higher than the glass transition temperature TgA of the sealing body 27 is ¹/₁₀ or less of the Young's modulus of the sealing body 27 in the temperature region TC2 having a highest temperature UC2 that is lower than the glass transition temperature TgA. As a result, the stress imparted by the sealing body 27 to the substrate 22 in the high temperature region TC1 can be reduced to an extremely low level, while a compressive stress is imparted by the sealing body 27 to the substrate 22 in the low temperature region TC2. Accordingly, damage of the substrate 22 can be suppressed, and the long-term reliability of the electronic component 21 can be improved.

Further, the glass transition temperature TgA of the sealing body 27 in the electronic component 21 of the embodiment illustrated in FIG. 1 is preferably at least 40° C. but not more than 90° C. This enables the tensile stress imparted by the sealing body 27 to the substrate 22 in the operating temperature range for the electronic component 21 to be reduced, enables damage of the substrate 22 to be reduced, and enables the long-term reliability of the electronic component 21 to be improved. In terms of reducing the stress imparted by the sealing body 27 to the substrate 22, the glass transition temperature TgA of the sealing body 27 is more preferably at least 40° C. but not more than 60° C.

The amount of the inorganic filler in the sealing body 27 of the electronic component 21 in the embodiment illustrated in FIG. 1 is 90±2 wt %. The sealing body 27 preferably contains from 75 wt % to 94 wt % of the inorganic filler. This enables the coefficient of linear expansion and the Young's modulus in the low temperature region to be set to favorable values.

Further, in the electronic component 21 in the embodiment illustrated in FIG. 1, the resin for the sealing body 27 is a heat-curable resin, and contains an epoxy-based component and a rubber-based component. However, the heat-curable resin of the sealing body 27 may contain an epoxy-based component but not contain a rubber-based component. Even in this embodiment, the coefficient of linear expansion and the Young's modulus in the low temperature region and the high temperature region can still be set to favorable values.

Figure 6:
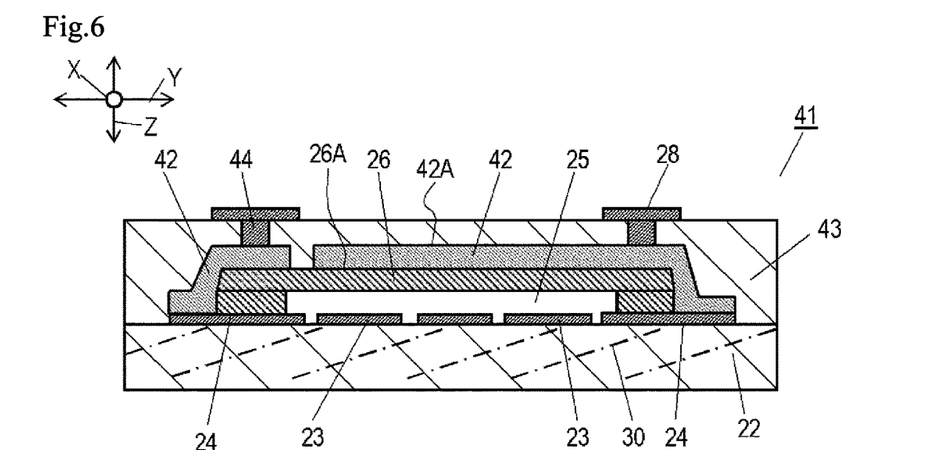
FIG. 6 is a schematic cross-sectional view of another embodiment of an electronic component.

FIG. 6 is a schematic cross-sectional view of an electronic component 41 in accordance with another embodiment of the present invention. In FIG. 6, those portions which are the same as those of the electronic component 21 in the embodiment illustrated in FIG. 1 are labeled using the same reference numbers. Like the electronic component 21 in the embodiment illustrated in FIG. 1, the electronic component 41 in the embodiment illustrated in FIG. 6 comprises an elastic wave device.

The electronic component 41 in the embodiment illustrated in FIG. 6 comprises a sealing body 43 and a connection electrode 44 instead of the sealing body 27 and the connection electrode 29 of the electronic component 21 of the embodiment illustrated in FIG. 1, and further comprises a metal body 42. The metal body 42 is connected to the wiring 24, and is provided on the upper surface 26A of the cover 26. The metal body 42 is disposed on the surface of the cover 26 opposite the surface facing the space 25. The sealing body 43 covers the metal body 42 from an upper surface 42A of the metal body 42, and is formed from the same composition as the sealing body 27 in the embodiment illustrated in FIG. 1. The connection electrode 44 penetrates through the sealing body 43 and connects the terminal electrode 28 and the metal body 42. The metal body 42 ensures that the electronic component 41, and particularly the space 25, has satisfactory mechanical strength. The metal body 42 is formed by electrolytic copper plating on the upper surface 26A of the cover 26, is composed mainly of metallic copper, and undergoes crystallization and contraction in the heat-curing treatment step for the sealing body 43 at 180° C. during production. In the operating temperature range for the electronic component 41 of −55° C. to 125° C., the coefficient of linear expansion of the metal body 42 is 20.5 ppm/° C., and the Young's modulus is 123 GPa. The electronic component 41 in the embodiment illustrated in FIG. 6 is affected by the thermal expansion and thermal contraction of the sealing body 43 and the metal body 42.

Figure 7:
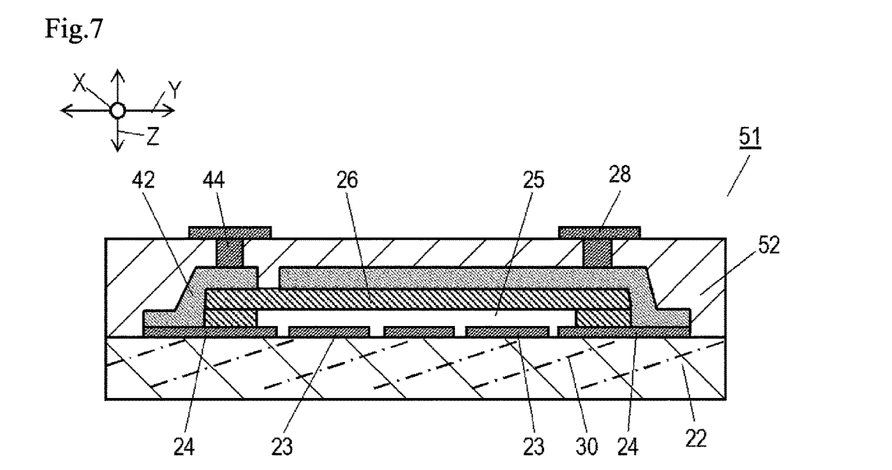
FIG. 7 is a schematic cross-sectional view of an electronic component of a comparative example.

FIG. 7 is a schematic cross-sectional view of an electronic component 51 of a comparative example. In FIG. 7, those portions which are the same as those of the electronic component 41 in the embodiment illustrated in FIG. 6 are labeled using the same reference numbers. The electronic component 51 of the comparative example comprises a sealing body 52 formed from the same composition as the sealing body 7 of the conventional electronic component 1 illustrated in FIG. 14A and FIG. 14B instead of the sealing body 43 of the electronic component 41 of the embodiment illustrated in FIG. 6.

In the electronic component 41 of the embodiment illustrated in FIG. 6, the stresses imparted to the substrate 22 by the sealing body 43 and the metal body 42 are described below with reference to FIG. 8-FIG. 11.

Figure 8:
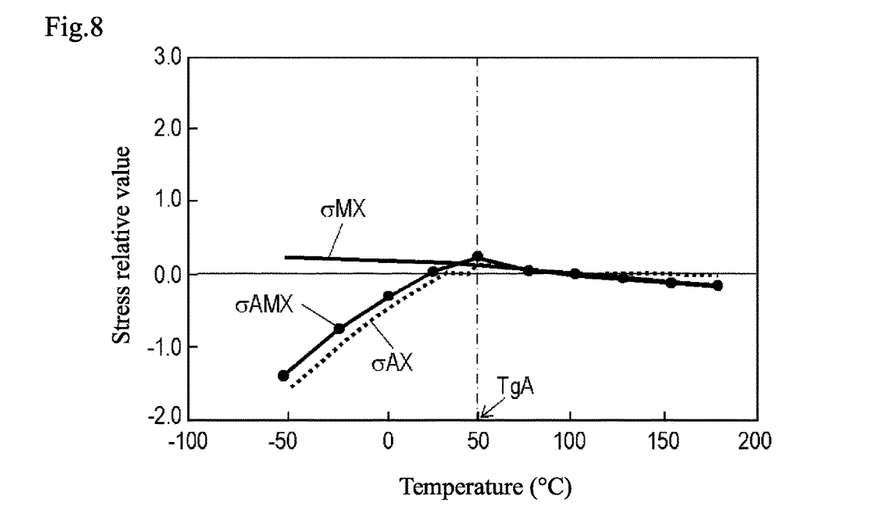
FIG. 8 is a diagram illustrating a first set of temperature characteristics of the sealing body of the electronic component of FIG. 6.
Figure 9:
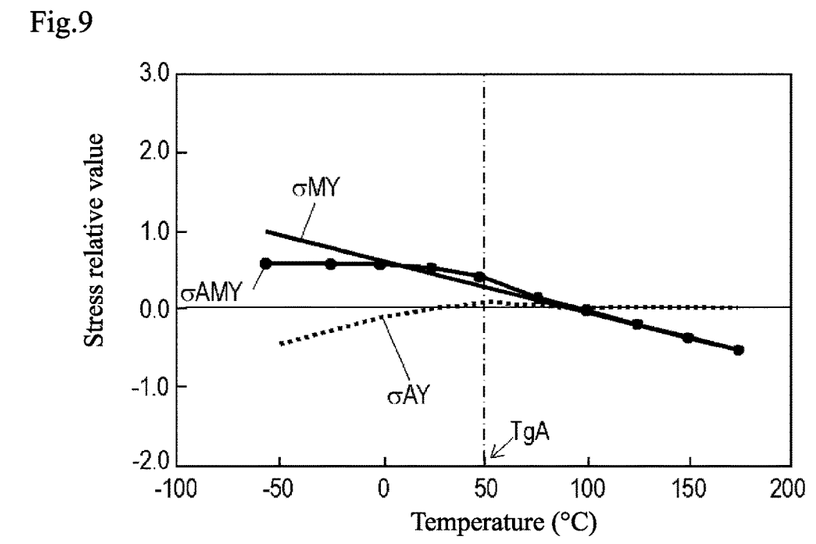
FIG. 9 is a diagram illustrating a second set of temperature characteristics of the sealing body of the electronic component of FIG. 6.

FIG. 8 and FIG. 9 are diagrams illustrating the characteristics of the sealing body 43 of the electronic component 41 in the embodiment illustrated in FIG. 6.

FIG. 8 illustrates, for the electronic component 41 of the embodiment illustrated in FIG. 6, the change in the relative value σAX for the X-axis direction stress imparted by the sealing body 43 to the substrate 22 relative to temperature, and the change in the relative value σMX for the X-axis direction stress imparted by the metal body 42 to the substrate 22 relative to temperature. In FIG. 8, the vertical axis indicates the relative value for the stress, and the horizontal axis indicates the temperature. Each of the relative values σAX and σMX for the stress can be determined by simulation using the coefficient of linear expansion and the Young's modulus. FIG. 8 also illustrates the change in the relative value σAMX for the overall stress, obtained by combining the relative value σAX for the X-axis direction stress from the sealing body 43 and the relative value σMX for the X-axis direction stress from the metal body 42, relative to the temperature.

As illustrated in FIG. 8, the relative value σAMX for the overall stress which combines the X-axis direction stresses from the sealing body 43 and the metal body 42 represents a compressive stress at temperatures of 25° C. or lower and temperatures of 100° C. or higher, and represents a tensile stress at temperatures of 25° C. to 100° C., with the tensile stress reaching a maximum at about 50° C. In this manner, the tensile stress of the metal body 42 increases as the temperature decreases. However, because the sealing body 43 presses against the upper surface 42A of the metal body 42 with a compressive stress, the overall combination of the sealing body 43 and the metal body 42 cancels out the tensile stress of the metal body 42, and can reduce the level of tensile stress. Accordingly, destruction of the substrate 22 starting from the cleavage planes 30 can be suppressed.

FIG. 9 illustrates, for the electronic component 41 of the embodiment illustrated in FIG. 6, the change in the relative value σAY for the Y-axis direction stress imparted by the sealing body 43 to the substrate 22 relative to temperature, and the change in the relative value σMY for the Y-axis direction stress imparted by the metal body 42 to the substrate 22 relative to temperature. In FIG. 9, the vertical axis indicates the relative value for the stress, and the horizontal axis indicates the temperature. Each of the relative values σAY and σMY for the stress can be determined by simulation using the coefficient of linear expansion and the Young's modulus. FIG. 9 also illustrates the change in the relative value σAMY for the overall stress, obtained by combining the relative value σAY for the Y-axis direction stress from the sealing body 43 and the relative value σMY for the Y-axis direction stress from the metal body 42, relative to the temperature.

As illustrated in FIG. 9, the relative value σAMY for the overall stress which combines the Y-axis direction stresses from the sealing body 43 and the metal body 42 represents a compressive stress at temperatures of 100° C. or higher, and represents a tensile stress at temperatures of 100° C. or lower, with the tensile stress reaching a maximum value of about 0.6. In the Y-axis direction, because the difference between the coefficient of linear expansion of the metal body 42 and the coefficient of linear expansion of the substrate 22 is large, the tensile stress increases as the temperature decreases. However, because the sealing body 43 presses against the upper surface 42A of the metal body 42 with a compressive stress, the overall combination of the metal body 42 and the sealing body 43 can reduce the tensile stress applied to the substrate 22, thus inhibiting destruction of the substrate 22, starting from the cleavage planes 30, caused by the tensile stress of the metal body 42. By ensuring that the Young's modulus of the sealing body 43 is sufficiently large in the low-temperature region, the level of tensile stress caused by contraction of the metal body 42 can be controlled.

Figure 10:
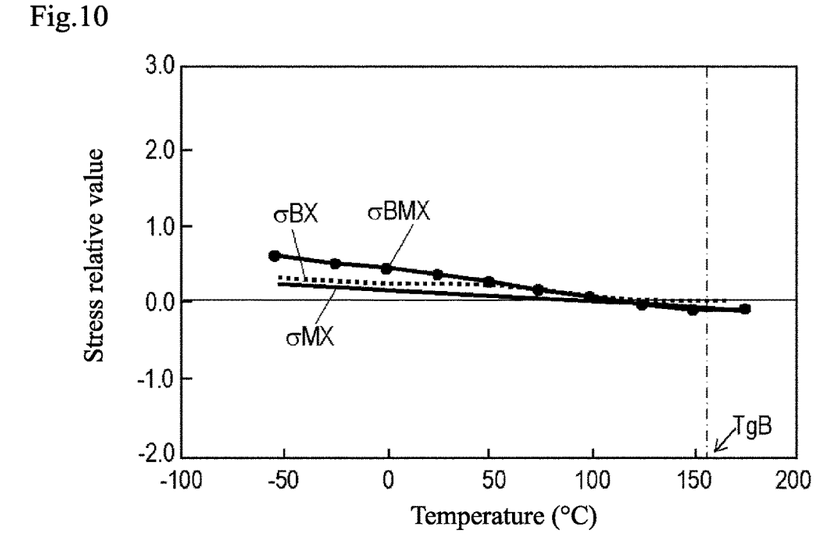
FIG. 10 is diagram illustrating a first set of characteristics of the sealing body of the electronic component of FIG. 7.
Figure 11:
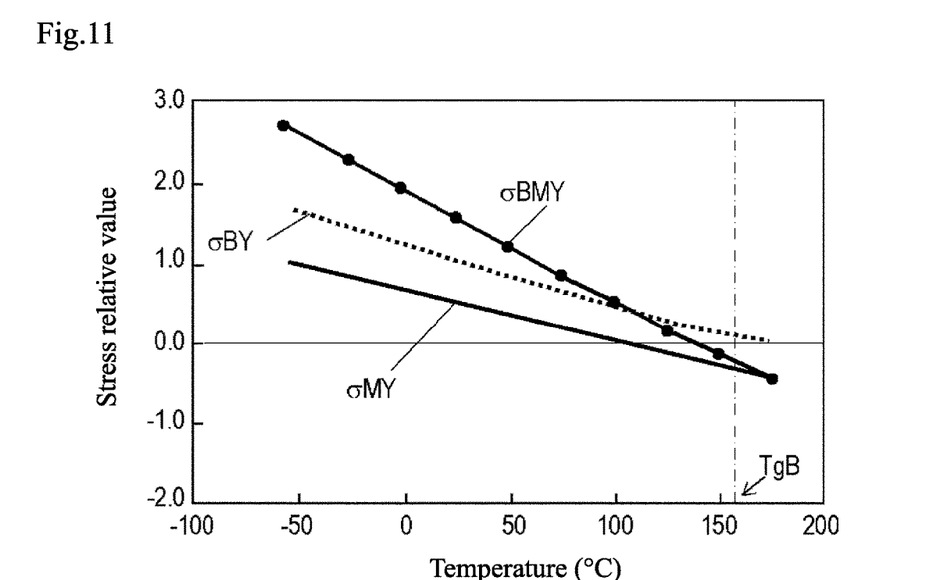
FIG. 11 is diagram illustrating a second set of temperature characteristics of the sealing body of the electronic component of FIG. 7.

FIG. 10 and FIG. 11 are diagrams illustrating the characteristics of the sealing body 52 of the electronic component 51 of the comparative example.

FIG. 10 illustrates, for the electronic component 51 of the comparative example, the change in the relative value σBX for the X-axis direction stress imparted by the sealing body 52 to the substrate 22 relative to temperature, and the change in the relative value σMX for the X-axis direction stress imparted by the metal body 42 to the substrate 22 relative to temperature. In FIG. 10, the vertical axis indicates the relative value for the stress, and the horizontal axis indicates the temperature. Each of the relative values σBX and σMX for the stress can be determined by simulation using the coefficient of linear expansion and the Young's modulus. FIG. 10 also illustrates the change in the relative value σBMX for the overall stress, obtained by combining the relative value σBX for the X-axis direction stress from the sealing body 52 of the electronic component 51 of the comparative example and the relative value σMX for the X-axis direction stress from the metal body 42, relative to the temperature.

As illustrated in FIG. 10, in the electronic component 51 of the comparative example, the relative value σBMX for the overall stress which combines the X-axis direction stresses from the sealing body 52 and the metal body 42 represents a compressive stress at temperatures of 110° C. or higher, and represents a tensile stress at temperatures of 110° C. or lower, with the tensile stress reaching about 0.7 at −55° C. Accordingly, in the electronic component 51 of the comparative example, as the temperature decreases, the X-axis direction tensile stress from the sealing body 52 and the metal body 42 becomes stronger. However, the size of the tensile stress is comparatively small, and the probability of the substrate 22 rupturing in the X-axis direction from the cleavage planes 30 is not very high.

FIG. 11 illustrates, for the electronic component 51 of the comparative example, the change in the relative value σBY for the Y-axis direction stress imparted by the sealing body 52 to the substrate 22 relative to temperature, and the change in the relative value σMY for the Y-axis direction stress imparted by the metal body 42 to the substrate 22 relative to temperature. In FIG. 11, the vertical axis indicates the relative value for the stress, and the horizontal axis indicates the temperature. Each of the relative values σBY and σMY for the stress can be determined by simulation using the coefficient of linear expansion and the Young's modulus. FIG. 11 also illustrates the change in the relative value σBMY for the overall stress, obtained by combining the relative value σBY for the Y-axis direction stress from the sealing body 52 of the electronic component 51 of the comparative example and the relative value σMY for the Y-axis direction stress from the metal body 42, relative to the temperature.

As illustrated in FIG. 11, in the electronic component 51 of the comparative example, the relative value σBMY for the overall stress which combines the Y-axis direction stresses from the sealing body 52 and the metal body 42 represents a compressive stress at temperatures of 130° C. or higher, and represents a tensile stress at temperatures of 130° C. or lower. The tensile stress increases as the temperature decreases, and reaches a value of about 2.7 at −55° C. In this manner, in the electronic component 51 of the comparative example, the Y-axis direction tensile stress from the sealing body 52 and the metal body 42 becomes stronger as the temperature decreases, and because the size of the tensile stress becomes quite large, the probability of the substrate 22 rupturing from the cleavage planes 30 is high.

In the electronic component 41 in the embodiment illustrated in FIG. 6, in a similar manner to that illustrated in FIG. 2 for the sealing body 27 and the substrate 22 of the electronic component 21 in the embodiment illustrated in FIG. 1, in the temperature region TB1 having a lowest temperature LB1 that is at least as high as the glass transition temperature TgA of the sealing body 43, the coefficient of linear expansion αA of the sealing body 43 is greater than the coefficients of linear expansion αX and αY of the substrate 22, whereas in the temperature region TB2 having a highest temperature UB2 that is lower than the glass transition temperature TgA, the coefficient of linear expansion αA of the sealing body 43 is less than the coefficients of linear expansion αX and αY of the substrate 22. As a result, the stress imparted by the sealing body 43 to the substrate 22 can be a tensile stress at high temperatures and a compressive stress at low temperatures. Accordingly, the stress imparted by the metal body 42 to the substrate 22 can be canceled out, and destruction of the substrate 22 can be reduced, meaning the long-term reliability of the electronic component 41 can be improved.

In the electronic component 41 in the embodiment illustrated in FIG. 6, in a similar manner to that illustrated in FIG. 3 for the sealing body 27 of the electronic component 21 in the embodiment illustrated in FIG. 1, the Young's modulus of the sealing body 43 in the temperature region TC1 having a lowest temperature LC1 that is higher than the glass transition temperature TgA of the sealing body 43 is ⅒ or less of the Young's modulus of the sealing body 43 in the temperature region TC2 having a highest temperature UC2 that is lower than the glass transition temperature TgA. As a result, the stress imparted by the sealing body 43 to the substrate 22 at high temperatures can be reduced significantly, and the tensile stress imparted by the metal body 42 to the substrate 22 at high temperatures can be reduced. Accordingly, damage of the substrate 22 can be suppressed, and the long-term reliability of the electronic component 41 can be improved.

The electronic components 21 and 41 in the embodiments illustrated in FIG. 1 and FIG. 6, respectively, are elastic wave devices. However, provided the device is an electronic component having a structure in which the substrate 22 is covered with the sealing body 27 (43), a relative stress is generated in the substrate 22 or the sealing body 27 (43) as a result of the difference in the coefficients of linear expansion of the substrate 22 and the sealing body 27 (43). That stress can cause cracking in the substrate 22, resulting in the possibility of damage to the electronic component 21 and 41. Accordingly, setting the temperature coefficients of the sealing bodies 27 and 43 of the electronic components 21 and 41 in the manner described above enables the internal stress within the electronic components 21 and 41 at high temperatures and low temperatures to be reduced, and as a result, the long-term reliability can be improved.

It should be appreciated that embodiments and methods of reducing the stress of a substrate of an elastic wave device can also be applied to other electronic components besides elastic wave devices.

Figure 12:
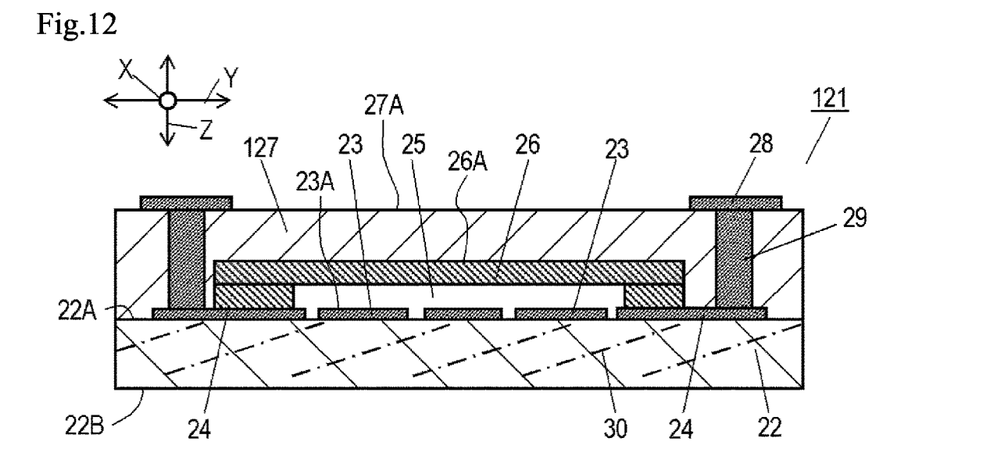
FIG. 12 is a schematic cross-sectional view of another embodiment of an electronic component.

FIG. 12 is a schematic cross-sectional view of an electronic component 121 in accordance with another embodiment of the present invention. In FIG. 12, those portions which are the same as those of the electronic component 21 in the embodiment illustrated in FIG. 1 are labeled using the same reference numbers. Like the electronic component 21 in the embodiment illustrated in FIG. 1, the electronic component 121 in the embodiment illustrated in FIG. 12 is an elastic wave device.

The electronic component 121 in the embodiment illustrated in FIG. 12 comprises a sealing body 127 instead of the sealing body 27 of the electronic component 21 of the embodiment illustrated in FIG. 1. The sealing body 127 has the same shape as the sealing body 27 in the embodiment illustrated in FIG. 1, and covers the comb-shaped electrode 23 from the upper surface 26A of the cover 26 with the space 25 disposed therebetween.

The sealing body 127 is formed from a different material from the sealing body 27 in the embodiment illustrated in FIG. 1. The sealing body 127 is an insulating body formed by heat-curing a material comprising 30 wt % of a heat-curable resin and 70 wt % of a negative expansion material. The heat-curable resin contains an epoxy-based component and a rubber-based component. The components of the heat-curable resin are adjusted so that the curing temperature for the sealing body 127 is 180° C., and the glass transition temperature TgA measured using a DMA device is 50° C.

By using this type of configuration, any damage to the substrate 22 in the electronic component 121 caused by temperature fluctuations within the operating temperature range from −55° C. to 125° C. can be suppressed, thus improving the reliability upon prolonged use.

The negative expansion material has a property wherein the volume of the material decreases as the temperature increases within a specified temperature region, and the material therefore exhibits a negative coefficient of linear expansion within that temperature region. Examples of materials that can be used as the negative expansion material include complex oxides such as zirconium tungstate ($ZrW_2O_8$), silicon oxides ($Li_2O-Al_2O_3-nSiO_2$), $HfW_2O_8$ and $BiNiO_3$, and manganese nitrides having an inverse perovskite structure ($Mn_3XN$).

The negative expansion material preferably has a negative coefficient of linear expansion for the entire operating temperature range for the electronic component 121. Moreover, the negative expansion material is preferably composed of a single component which has a negative coefficient of linear expansion for the entire operating temperature range for the electronic component 121. However, in the case of negative expansion materials for which the temperature region having a negative coefficient of linear expansion is narrow, a plurality of negative expansion material components having different temperature regions for which the coefficient of linear expansion is negative may be combined, so that the overall combination of the negative expansion materials has a negative coefficient of linear expansion across essentially the entire operating temperature range for the electronic component 121.

The sealing body 127 of the electronic component 121 in the embodiment illustrated in FIG. 12 has the same characteristics as those illustrated in FIG. 2 to FIG. 5 for the sealing body 27 of the electronic component 21 in the embodiment illustrated in FIG. 1, and hence has the same effects.

In terms of the Young's modulus of the sealing body 127, by adjusting the composition of the negative expansion material and the blend ratio between the heat-curable resin and the negative expansion material, the same temperature characteristics as those illustrated in FIG. 3 for the Young's modulus EA of the sealing body 27 of the embodiment illustrated in FIG. 1 can be achieved.

By including the negative expansion material having a negative coefficient of linear expansion in the sealing body 127 of the electronic component 121, the coefficient of linear expansion of the sealing body 127 can be suppressed to an extremely small value, in a similar manner to the sealing body 27 in the embodiment illustrated in FIG. 1. As a result, internal stress within the electronic component 121 due to temperature fluctuations can be reduced, and failures of the electronic component 121 can be reduced.

The amount of the negative expansion material in the sealing body 127 in the embodiment illustrated in FIG. 12 is 70%, but by adjusting the amount of the negative expansion material in the sealing body 127 to a value within a range from 65% to 80%, the coefficient of linear expansion and the Young's modulus in each of the temperature regions TB1, TB2, TC1 and TC2 can be set to favorable values.

The sealing body 127 contains the negative expansion material as the filler added to the heat-curable resin. When an inorganic material such as $SiO_2$ is used as the filler for the sealing body 127, a fill ratio exceeding 80% is enables the coefficient of linear expansion of the sealing body 127 to satisfy the conditions described above. If the fill ratio of the inorganic filler is high, then when the sealing body 127 is handled in sheet form, it may become brittle and more likely to develop cracks or fissures. However, by using a negative expansion material as the filler for the heat-curable resin, the fill ratio can be reduced to 80% or less. Accordingly, compared with implementations where an inorganic material such as $SiO_2$ is used, cracks or fissures are less likely to occur in a sheet form of the sealing body 127, and therefore handling of the sealing body 127 in sheet form becomes less troublesome. When a lower profile is desired for the electronic component 121, using the sealing body 127 in sheet form enables the height to be controlled with good precision. When the sealing body 127 is formed using a liquid sealing material, a grinding step may be utilized to control the height of the electronic component 121. However, by using the sealing body 127 in sheet form, the sealing body 127 can be reduced in thickness at the production stage, meaning the grinding step can be omitted, thus enabling a reduction in the production costs for the electronic component 121.

Further, in the processing of the electronic component 121, laser processing may be used in steps such as dividing the semiconductor wafer into individual pieces and via hole drilling. In laser processing, if the filler content of the sealing body 127 is high and a large amount of the filler exists at the portion irradiated by the laser, then detachment of the filler can cause a reduction in the processing precision or a reduction in the processing rate, making processing of the sealing body 127 difficult. However, when a negative expansion material is used as the filler, because the amount of the filler in the sealing body 127 can be reduced, laser processing can be performed more easily.

Figure 13:
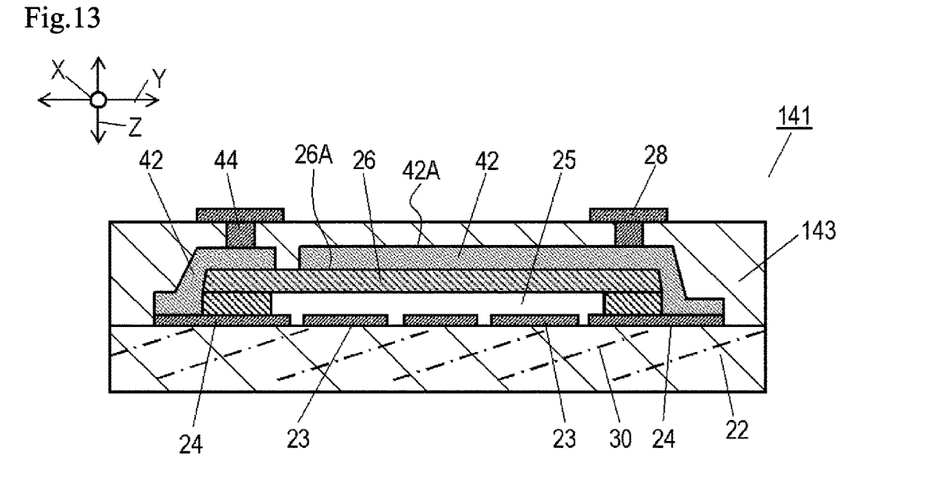
FIG. 13 is a schematic cross-sectional view of another embodiment of an electronic component.

FIG. 13 is a schematic cross-sectional view of an electronic component 141 in accordance with another embodiment of the present invention. In FIG. 13, those portions which are the same as those of the electronic component 41 in the embodiment illustrated in FIG. 6 are labeled using the same reference numbers. Like the electronic component 41 in the embodiment illustrated in FIG. 6, the electronic component 141 in the embodiment illustrated in FIG. 13 is an elastic wave device.

The electronic component 141 in the embodiment illustrated in FIG. 13 comprises a sealing body 143 instead of the sealing body 43 of the electronic component 41 in the embodiment illustrated in FIG. 6. The sealing body 143 has the same shape as the sealing body 43 in the embodiment illustrated in FIG. 6, and covers the comb-shaped electrode 23 from the upper surface 42A of the metal body 42 and the upper surface 26A of the cover 26, with the space 25 disposed therebetween. The sealing body 143 has the same composition as the sealing body 127 of the electronic component 121 in the embodiment illustrated in FIG. 12, and comprises a negative expansion material.

The sealing body 143 of the electronic component 141 in the embodiment illustrated in FIG. 13 has the same characteristics as those illustrated in FIG. 8 to FIG. 11 for the sealing body 43 of the electronic component 41 in the embodiment illustrated in FIG. 6, and hence has the same effects.

The electronic components 121 and 141 in the embodiments illustrated in FIG. 12 and FIG. 13, respectively, are elastic wave devices. However, provided the device is an electronic component having a structure in which the substrate 22 is covered with the sealing body 127 (143), a relative stress is generated in the substrate 22 or the sealing body 127 (143) as a result of the difference in the coefficients of linear expansion of the substrate 22 and the sealing body 127 (143). That stress can cause cracking in the substrate 22, resulting in the possibility of damage to the electronic component 121 and 141. Accordingly, including the negative expansion material in the sealing materials 127 and 143 of the electronic components 121 and 141 enables the internal stress within the electronic components 121 and 141 at high temperatures and low temperatures to be reduced, and as a result, the long-term reliability can be improved, and the invention can also be applied to other electronic components besides elastic wave devices.

In the above embodiments, terms which indicate direction such as "upper surface" and "lower surface" are used to indicate relative directions that are dependent only upon the relative positional relationships between the structural parts of the electronic component such as the substrate and the sealing body, and in no way indicate absolute directions such as the vertical direction or the like.

Embodiments of the electronic component disclosed herein are useful for electronic components used in a variety of electronic equipment, and is especially useful in electronic components that use housing technology known as wafer-level packaging in which the outer dimensions of the substrate and the electronic component are substantially equal, and in elastic wave devices such as high-frequency filters, splitters and duplexers used mainly in mobile communication equipment.

REFERENCE SIGNS LIST

21: Electronic component
22: Substrate
23: Comb-shaped electrode (functional section)
24: Wiring
25: Space
26: Cover
27: Sealing body
28: Terminal electrode
29: Connection electrode
41: Electronic component
43: Sealing body
121: Electronic component
127: Sealing body
141: Electronic component
143: Sealing body
TB1: Temperature region (first temperature region)
TB2: Temperature region (second temperature region)
TC1: Temperature region (first temperature region)
TC2: Temperature region (second temperature region)
TgA: Glass transition temperature

The invention claimed is:

1. An electronic component comprising:
a substrate;
a functional section provided on the substrate; and
a sealing body provided on the substrate, sealing the functional section, and suppressing damage to the substrate caused by temperature fluctuations within an operating temperature range of between −55° C. and 125° C., the sealing body including a resin containing an epoxy-based component and a rubber-based component and having a positive coefficient of linear expansion within the operating temperature range.

2. The electronic component of claim 1 wherein a coefficient of linear expansion of the sealing body is greater than a coefficient of linear expansion of the substrate in a first temperature region having a lowest temperature that is at least as high as a glass transition temperature of the sealing body and less than a coefficient of linear expansion of the substrate in a second temperature region having a highest temperature that is lower than the glass transition temperature of the sealing body.

3. The electronic component of claim 1 wherein the substrate is composed of a piezoelectric material.

4. The electronic component of claim 1 wherein the sealing body includes a negative expansion material having a negative coefficient of linear expansion.

5. The electronic component of claim 1 wherein the sealing body includes 75 wt % to 94 wt % of an inorganic filler.

6. An electronic component comprising:
a substrate including a piezoelectric material;
a functional section provided on the substrate and including a comb-shaped electrode; and
a sealing body provided on the substrate, sealing the functional section within a space provided above the comb-shaped electrode and suppressing damage to the substrate caused by temperature fluctuations within an operating temperature range of between −55° C. and 125° C., a coefficient of linear expansion of the sealing body being greater than a coefficient of linear expansion of the substrate in a first temperature region having a lowest temperature that is at least as high as a glass transition temperature of the sealing body and less than a coefficient of linear expansion of the substrate in a second temperature region having a highest temperature that is lower than the glass transition temperature of the sealing body, the coefficient of linear expansion of the sealing body being positive throughout the operating temperature range.

7. An electronic component comprising:
a substrate;
a functional section provided on the substrate; and
a sealing body provided on the substrate and sealing the functional section, the sealing body suppressing damage to the substrate caused by temperature fluctuations within an operating temperature range of between −55° C. and 125° C. by imparting a compressive stress to the substrate at temperatures within the operating temperature range below the glass transition temperature of the sealing body, the sealing body including a resin containing an epoxy-based component and a rubber-based component and a negative expansion material having a negative coefficient of linear expansion, the sealing body having a positive coefficient of linear expansion within the operating temperature range.

8. The electronic component of claim 2 wherein the glass transition temperature of the sealing body is between 40° C. and 90° C.

9. The electronic component of claim 2 wherein the sealing body imparts a compressive stress to the substrate at temperatures within the operating temperature range below the glass transition temperature of the sealing body.

10. The electronic component of claim 9 wherein the sealing body imparts the compressive stress to the substrate at temperatures within the operating temperature range on both sides of the glass transition temperature of the sealing body.

11. The electronic component of claim 3 wherein the functional section includes a comb-shaped electrode.

12. The electronic component of claim 11 wherein the sealing body defines a space above the comb-shaped electrode and seals the comb-shaped electrode in the space.

13. The electronic component of claim 12 further comprising a cover enclosing the space, the sealing body covering an upper surface of the cover opposite a surface of the cover facing the space.

14. The electronic component of claim 13 further comprising a metal body disposed on an upper surface of the cover opposite a surface facing the space, the sealing body covering a surface of the metal body opposite a surface of the metal body facing the space.

15. The electronic component of claim 4 wherein the sealing body further comprises a plurality of negative expansion materials each having a different temperature region in which a coefficient of linear expansion of a respective one of the plurality of negative expansion materials is negative.

16. The electronic component of claim 6 wherein a Young's modulus of the sealing body in a first temperature region having a lowest temperature that is higher than a glass transition temperature of the sealing body is $\frac{1}{10}$ or less of a Young's modulus of the sealing body in a second temperature region having a highest temperature that is lower than the glass transition temperature.

17. The electronic component of claim 16 wherein the glass transition temperature is between 40° C. and 60° C.

18. The electronic component of claim 16 further comprising a metal body disposed between the space and the sealing body.

19. The electronic component of claim 6 wherein the sealing body includes a resin and 90±2 wt % of an inorganic filler.

\* \* \* \* \*